(12) United States Patent  (10) Patent No.: US 9,191,043 B1
Zhang et al.  (45) Date of Patent: Nov. 17, 2015

(54) DIRECT DIGITAL RF CONVERSION

(71) Applicant: HRL Laboratories, LLC, Malibu, CA (US)

(72) Inventors: Deying Zhang, Oak Park, CA (US); Mohiuddin Ahmed, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 71 days.

(21) Appl. No.: 14/074,582

(22) Filed: Nov. 7, 2013

Related U.S. Application Data (60) Provisional application No. 61/780,207, filed on Mar. 13, 2013.

(51) Int. Cl.
*H03H 9/46* (2006.01)
*H04B 1/10* (2006.01)

(52) U.S. Cl.
CPC ........................................ *H04B 1/10* (2013.01)

(58) Field of Classification Search
CPC ................................. H03H 9/46; H03M 3/344
USPC .................................................. 375/350, 316
See application file for complete search history.

(56) References Cited

U.S. PATENT DOCUMENTS

| | | | |
|---|---|---|---|
| 4,524,363 A | | 6/1985 | Kretschmer |
| 4,566,011 A | | 1/1986 | Lewis et al. |
| 4,893,316 A | * | 1/1990 | Janc et al. ..................... 708/300 |
| 5,537,435 A | | 7/1996 | Carney et al. |
| 6,411,653 B1 | | 6/2002 | Arunachalam et al. |
| 7,145,972 B2 | * | 12/2006 | Kumar et al. .................. 375/349 |
| 2003/0090400 A1 | * | 5/2003 | Barker .......................... 341/144 |
| 2005/0276335 A1 | | 12/2005 | Kumar |
| 2007/0126631 A1 | * | 6/2007 | Goldberg ...................... 342/378 |
| 2009/0075610 A1 | * | 3/2009 | Keehr et al. .................... 455/137 |

OTHER PUBLICATIONS

R. A. Scholtz, D. M. Pozar, and W. Namgoong, "Ultra-Wideband Radio", EURASIP Journal on Applied Signal Processing 2005:3, 252-272.

M. Mailand, R. Richter, and H. J. Jentschel, "IQ-imbalance and its compensation for non-ideal analog receivers comprising frequency-selective components", Adv. Radio Sci., 4, 189-195, 2006.

F.J. Harris, C. Dick, and M. Rice, "Digital receivers and transmitters using polyphase filter banks for wireless communications", 1395-1412, IEEE Transactions on Microwave Theory and Techniques, vol. 51, No. 4, 2003.

(Continued)

*Primary Examiner* — Michael Neff
(74) *Attorney, Agent, or Firm* — Ladas & Parry (57) ABSTRACT

A digital filter bank includes a first sample and hold unit, one or more second sample and hold units one or more quantizers and one or more polyphase component filters. In another aspect, a digital filter bank includes a first sample and hold unit, a discrete time commutator and one or more polyphase component filters. In another aspect, a method for digitally filtering a signal includes sampling an input signal at a first frequency, sampling and holding the first sampled signal at a second frequency, quantizing the one or more second sampled signals to output channelized signals, and filtering the one or more quantized signals and outputting one or more filtered signals using one or more polyphase component filters.

22 Claims, 6 Drawing Sheets

(56) References Cited

OTHER PUBLICATIONS

P.P. Vaidyanathan, "Multirate Systems and Filter Banks", Prentice-Hall, 1993.
R. Mahesh, A.P. Vinod, E. Lai, and A. Omondi, "Filter bank channelizers for multi-standard software defined radio receivers", Journal of Signal Processing Systems (2011) 62:157-171.
B. Farhang-Boroujeny, "Filter bank spectrum sensing for cognitive radios", 1801-1811, IEEE Transaction on Signal Processing, vol. 56, No. 5, 2008.
S. Wang, R. Inkol, S. Rajan, and F. Patenaude, "Detection of narrowband signal through the FFT and polyphase FFT filter banks: noncoherent versus coherent integration", 1424-1438, IEEE Transactions on Instrumentation and measurement, vol. 59, No. 5, 2010.
P. Aziz, H. V. Sorensen, and J. Van Der Spiegel, "An overview of sigma-delta converters: how a 1-bit ADC achieves more than 16-bit resolution", 61-84, IEEE Signal Processing Magazine, vol. 13, No. 1, 1996.
M. Vetterli, "A theory of multirate filter banks", 356-372, IEEE Transactions on Acoustics, Speech, and Signal Processing, vol. 35, No. 3, 1987.
R.C. Vaughan, N. L. Scott, and D.R. White, 1973-1984, "The theory of bandpass sampling", IEEE Transaction on Signal Processing, vol. 39, No. 9, 1991.
B. Schulte, M. Peter, R. Felbecker, W. Keusgen, R. Steffen, H. Schumacher, M. Hellfeld, A. Barghouthi, S. Krone, F. Guderian, G. P. Fettweis, and V. Ziegler, "60 GHz WLAN applications and implementation aspects", International Journal of Microwave and Wireless Technologies (2011), 3: 213-221.
Mertins, Alfred. "Signal Analysis: Wavelets, Filter Banks, Time-Frequency Trnasforms and Applications" John Wiley & Sons, 1999.
J. Miček and J. Kapitulik, "Car-to-car communication system", Proceedings of the International Multiconference on Computer Science and Information Technology, pp. 627-631, 2009 IEEE.
Zhang, et al. "A novel approach for using polyphase filter bank in directly digital RF conversion from RF to baseband." SPIE 2012.

\* cited by examiner

DIRECT DIGITAL RF CONVERSION

CROSS-REFERENCE TO RELATED APPLICATION(S)

This application claims the benefit of and priority to U.S. Provisional Application No. 61/780,207, filed Mar. 13, 2013, the entirety of which is incorporated herein by reference.

BACKGROUND

The construction of ultra-wideband (UWB) radios, including software defined radios (SDRs) and cognitive radios (CRs), is typically based on two design goals. First, an analog-to-digital converter (ADC) is preferably placed as near the antenna as possible in the chain of radio's frequency (RF) front-end components. Second, the resulting samples are preferably processed on a programmable microprocessor or signal processor. To satisfy these goals, analog components are typically replaced by digital building blocks in radio receivers to lessen circuitry effort (chip size, power consumption, etc.) in the analog domain. Furthermore, additional digital signal processing (DSP) is typically employed to remove spurious effect of the sub-optimum analog front-end.

Figure 1:
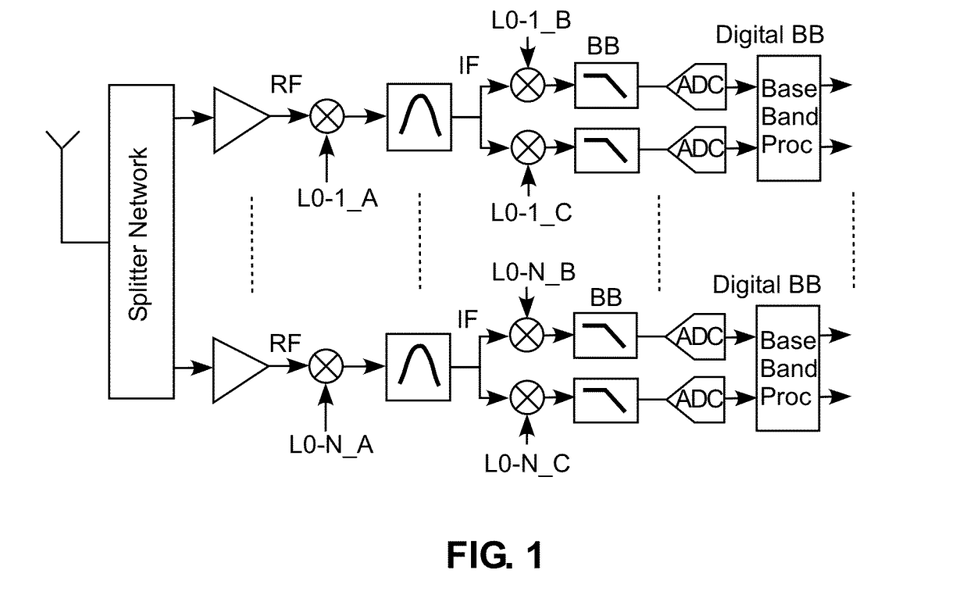
FIG. 1 depicts a block diagram of an N channel UWB receiver with analog RF and IF down conversion and digital baseband.

For analog receivers as shown in FIG. 1, an IQ-imbalance—where I is the in-phase component and Q is the quadrature component of a signal—can be a serious issue that can degrade the receiver's performance. The IQ-imbalance typically occurs due to amplitude and phase impairments between the local oscillator paths and due to mismatches between the respective IQ-branches after the analog down conversion. Such an IQ-imbalance may cause cross talk between in-phase and quadrature (I/Q) components. This, in turn, can cause coupling between the many narrowband channels, creating so-called "ghosts" or "images". To achieve an imbalance related spectral image 40 dB below a desired spectral term, each imbalance term must be less than 1% of the desired term. It is difficult to sustain, over time and temperature, gain and phase balance of analog components to better than 1%.

Figure 2:
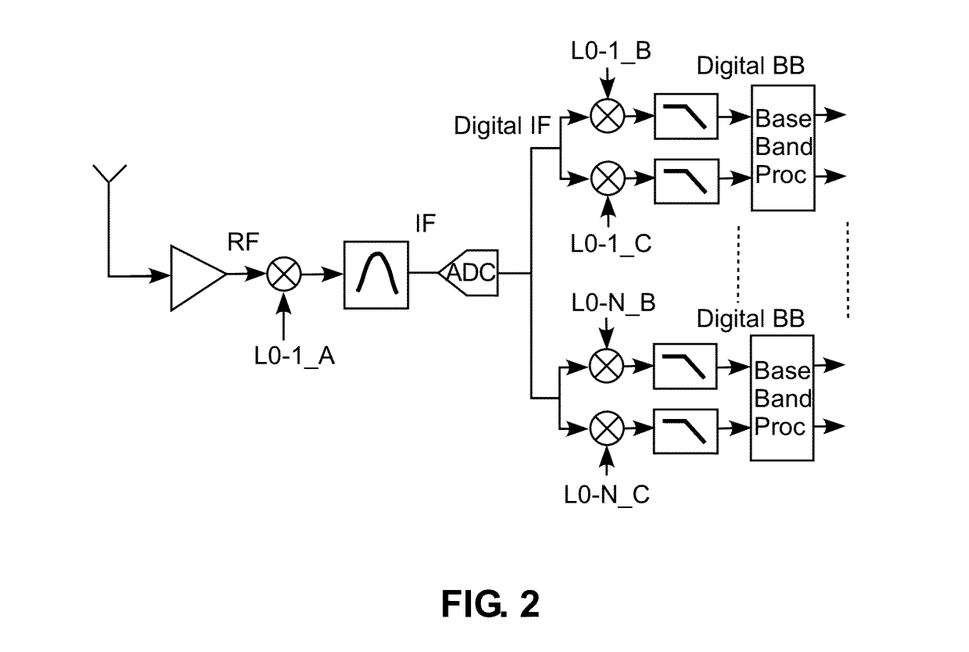
FIG. 2 depicts a block diagram of an N channel UWB receiver with analog RF down conversion, digital IF down conversion, and digital baseband.

Accordingly, IQ balancing typically involves a complex conversion process in the DSP domain. Filter bank techniques, especially a polyphase fast Fourier Transform (Polyphase FFT or "PFFT") filter bank, have been successfully used in UWB receivers for this purpose. In these receivers, as shown in FIG. 2, the conversion from analog to digital (or digital to analog) occurs at IF rather than at baseband. Therefore, the down conversion of the separated channels is performed by a set of digital down converters and digital low pass filters. Such DSP based complex down conversion does not introduce significant imbalance related spectral terms because the digital process can realize arbitrarily small levels of imbalance by controlling the number of bits involved in the arithmetic operations. Precision of coefficients used in the filtering process sets an upper bound to spectral artifact levels at −5 dB/bit so that 12-bit arithmetic can achieve image level below −60 dB, or −60 dBs/12 bits.

Figure 3A:
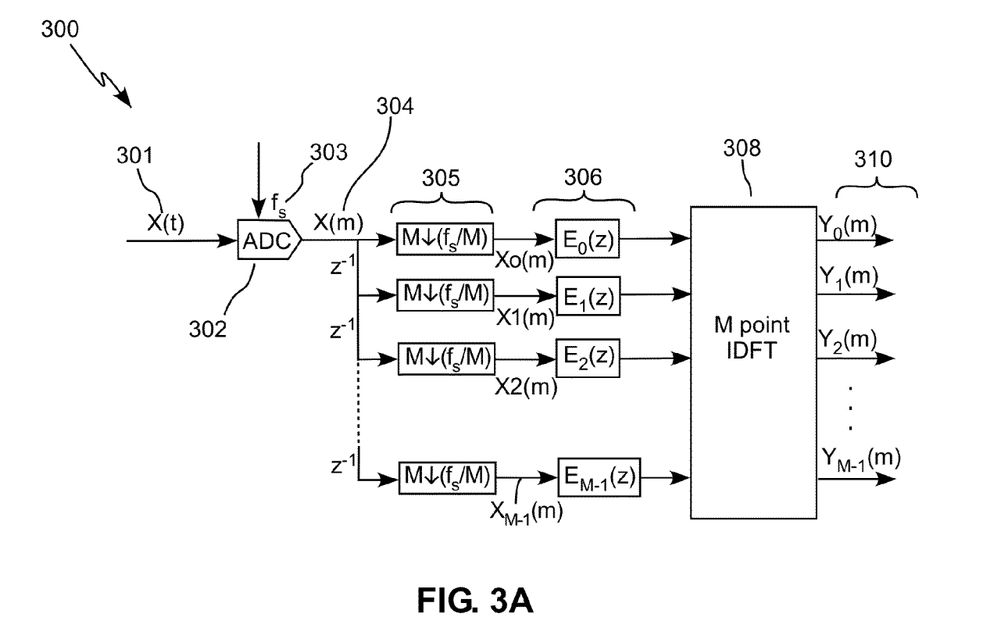
FIG. 3A depicts a block diagram of a Polyphase fast Fourier Transform (PFFT or "PFFT") filter bank structure.
Figure 3B:
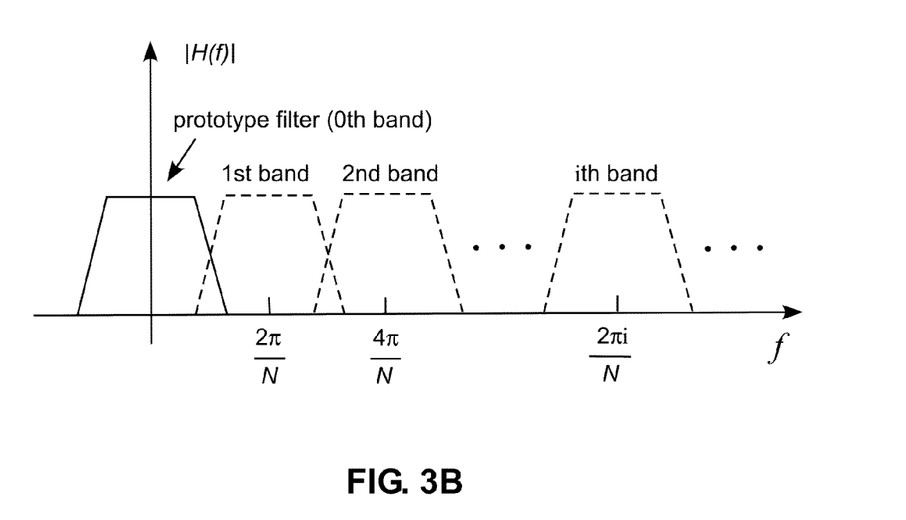
FIG. 3B depicts a block diagram of a Polyphase fast Fourier Transform (PFFT or "PFFT") filter bank spectrum.

Digital filter bank techniques, including the PFFT filter bank 300 (as diagrammatically shown in FIG. 3A and with a filter bank spectrum is depicted by FIG. 3B) with sampling frequency 303 of $f_s$ Hz, are key techniques utilized in UWB receivers for digital complex conversion process to move analog to digital conversion (ADC) from baseband to IF. As shown in FIG. 3A, one or more input signal(s) 301 may be sampled at a sampling frequency 303 by an ADC 302 to output a sampled signal 304. The sampled signal 304 is then typically downcoverted by one or more downconverters 305. In some cases, the one or more downconverters 305 utilize a downconverter sampling frequency of $f_s/M$. In each channel, the samples after downconversion by correspondent downconverter 305 can be filtered by correspondent subband filter 306. The filtered signals can be sent to M point Inverse Discrete Fourier Transform (IDFT) 308 to produce the output signals of $y_i(m)$ 310 for each channel.

Figure 4:
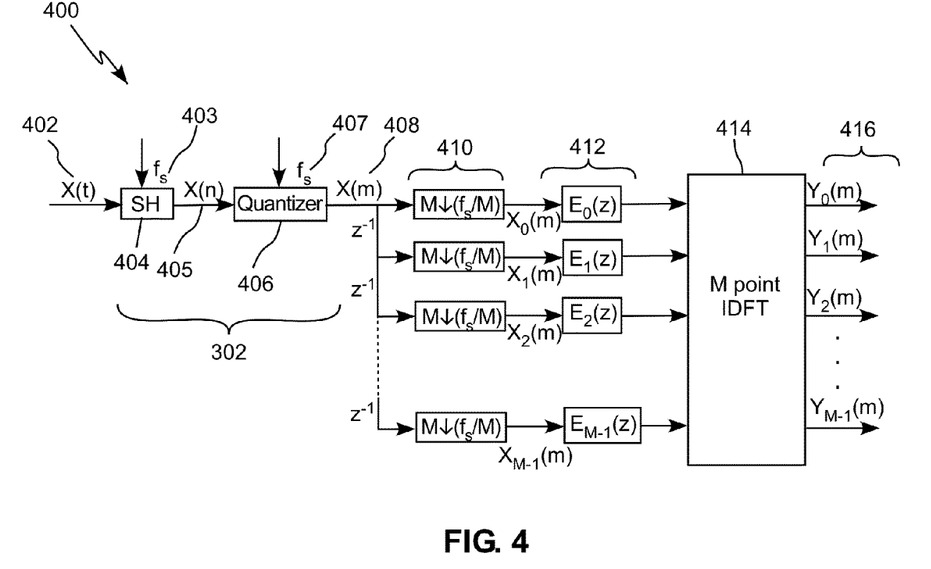
FIG. 4 depicts a block diagram of a PFFT filter bank showing an ADC structure.

Typically, a PFFT filter bank can only be applied in IF for IF down conversion. As shown in FIG. 4, the ADC 302 of FIG. 3A typically includes two building blocks: (1) a sample and hold (SH) unit 404 and a (2) quantizer unit 406.

The ADC 302 of the PFFT filter bank 300 as depicted includes a sample and hold (SH) unit and a quantizer. The SH unit 404 receives input signal X(t) 402 and samples it at a sampling frequency 403 of $f_s$ for outputting a signal X(n) 405 to the quantizer 406. The quantizer 406 samples the signal X(n) 405 at a sampling frequency 407, which is the same sampling frequency as the SH sampling frequency $f_s$, and outputs signal X(m) to one or more downconverters 410. In each channel, the samples after downconversion by the corresponding downconverter 410 can be filtered by the corresponding subband filter 412. The filtered signals can be sent to M point IDFT 414 to produce the output signals of $y_i(m)$ 416 for each channel. The downconverters 410 typically downconvert at a frequency $f_s/M$, where M is a downconverting decimation factor. The downconverted signals 412 are then converted by an M point inverse discrete Fourier transform apparatus 414 into one or more digital baseband channels 416.

Currently, the dynamic range and conversion speed of the ADC 302 becomes a limiting factor in the application of the architecture of receiver shown in FIG. 2. As discussed previously, the dynamic range of the ADC 302 converter is determined by the number of bits in the converter, with each bit contributing 5 dB. To achieve image levels below −60 dB, at least 12-bit resolution or dynamic range is required for the ADC 302. Additionally, the Nyquist criterion establishes the minimum sample rate to obtain alias free representation of the sampled signal. Under current techniques, with 12-bit dynamic range, the conversion speed of the ADC 302 is about 1 GHz, limiting the maximal signal bandwidth that the filter bank can work with to less than 500 MHz. For more than 8 bit resolution, the bandwidth for current PFFT is less than 500 MHz due to the maximal sampling frequency is less than 1 GHz. Due to these limitations, the filter bank techniques are restricted to IF digital conversion with signal bandwidth less than 500 MHz, let alone be applied to RF for RF digital conversion.

SUMMARY

An aspect of the technology described herein relates to a digital filter bank that includes a first sample and hold unit configured to sample an input signal at a first frequency and output one or more first sampled signals. One or more second sample and hold units are configured to sample the one or more first sampled signals at a second frequency and output one or more second sampled signals, and one or more quantizers are configured to receive and quantize the second sampled signal to output one or more quantized signals. One or more polyphase component filters filter the one or more quantized signals and output one or more filtered signals.

Another aspect of the technology described herein relates to a digital filter bank that includes a first sample and hold unit configured to sample an input signal at a first frequency and output one or more discrete time signals and a discrete time commutator configured to receive and demultiplex the one or more first sampled signals to one or more corresponding quantizers and output one or more quantized signals.

One or more polyphase component filters receive and filter the one or more quantized signals and output one or more filtered signals.

Another aspect of the technology described herein relates to a method for digitally filtering a signal that includes sampling an input signal at a first frequency to output one or more first sampled signals, sampling and holding the first sampled signal at a second frequency to output one or more second sampled signals, quantizing the one or more second sampled signals to output channelized signals, and filtering the one or more quantized signals and outputting one or more filtered signals using one or more polyphase component filters.

DETAILED DESCRIPTION

The present technology relates to an apparatus, system, and method for making the same related to a direct digital RF conversion. Each apparatus, system and method may include one or more embodiments in any combination. The features of any embodiment may be used in combination with any other embodiment. Furthermore, use of the term "top" and "bottom" is not intended to limit the orientation of any element(s), but is only used for convenience of discussion.

Figure 5A:
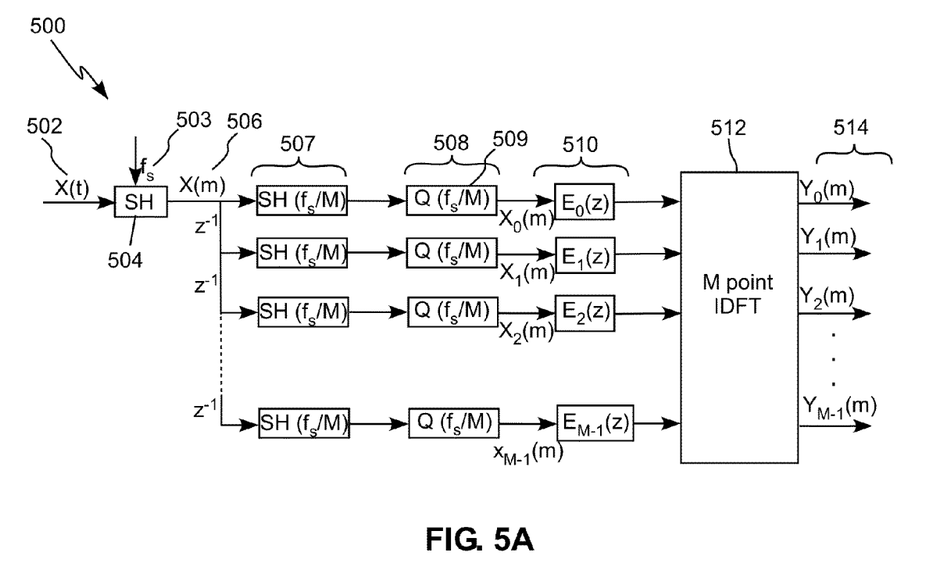
FIG. 5A depicts a block diagram of a PFFT with lower speed of quantization.

FIGS. 5A-5C illustrates some embodiment of a direct digital RF conversion system. Considering a first embodiment of FIG. 5A, a digital filter bank 500 is configured so that a first SH unit 504 is positioned, arranged or adapted in a main stream or main sample stream to generate a time-discrete sampling sequence X(m) 506 at an SH sampling frequency 503 of $f_s$. In some embodiments, the digital filter bank 500 is a PFFT ("PFFT"). The digital filter bank 500 is configured so that M second SH units 507 and M quantizer (Q) unit(s) 508 may be positioned arranged, configured and/or adapted to operate on each of the M channels to sample at a second sampling frequency that is the quantizer sampling frequency or speed 509 of $f_s/M$. The intrinsic decimation processing for a PFFT filter bank allows for this arrangement, since only the sample hold 504 must operate at a high speed, whereas high speed sampling for quantization is not necessary in each channel since the sampling frequency in each channel is 1/M of the original sampling frequency $f_s$, where M is the decimation factor and is typically equal to the number of channels. Thus, the M quantizer units 508 can each have a lower speed of quantization than the SH unit 504. For example, the SH unit 504 can have an SH sampling frequency 503 of $f_s$, while the quantization units 508 can have a quantizer sampling frequency or speed 509 of $f_s/M$. As illustrated in FIG. 5A, output signals from the quantizer units 508 are filtered by M polyphase components 510 $E_0(z) \ldots E_{M-1}(z)$, the output signals of which are processed by an M point Inverse Discrete Fourier Transform ("IDFT") 512. The IDFT 512 is configured to output/provide/produce one or more digital baseband channels (or signals) 514 $y_0(m) \ldots y_{M-1}(m)$. The output signals from polyphase components 510 $E_0(z) \ldots E_{M-1}(z)$ are the polyphase components of Finite Impulse Response ("FIR") filter in each branch. For FIR filter (H(z)), with length of N, where N, L, M are all positive integers, can be expressed as follows:

$$H(z) = \sum_{m=0}^{M-1} z^{-m} \cdot E_m(z^M) = \sum_{m=0}^{M-1} z^{-m} \sum_{l=0}^{L-1} h(l \cdot M + m) \cdot z^{-lM}$$

where h(n) is the impulse response of FIR filter at the time of nT, n is an integer, T is the sampling period of FIR filter, and polyphase components 510 $E_0(z) \ldots E_{M-1}(z)$ shown in FIG. 5A correspond to $E_m(z^M)$, m=0, 1, ..., M−1 in the equation after decimating by M.

Such an arrangement can provide a PFFT configured, designed, arranged and/or adapted to operate with a much lower speed of quantization.

Figure 5B:
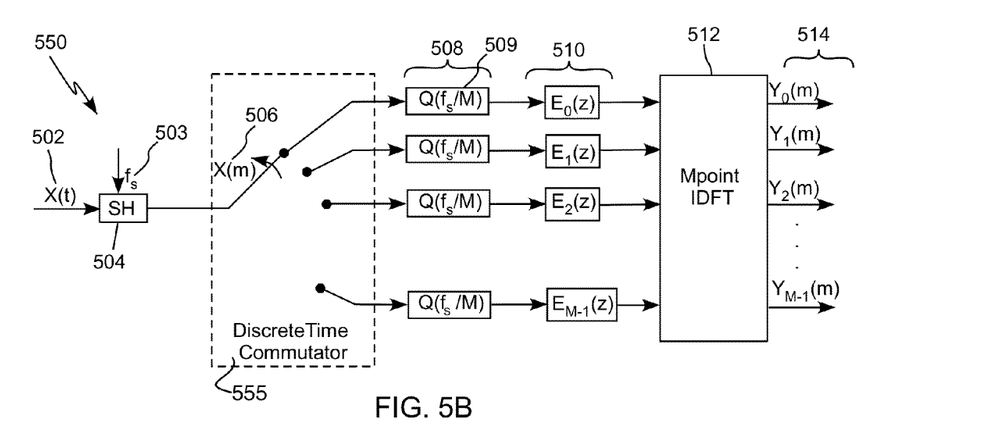
FIG. 5B depicts a block diagram of a PFFT with lower speed of quantization and a discrete time commutator.

In some embodiments, the delay and down sampling are implemented by a discrete-time commutator 555 as shown in FIG. 5B, which depicts many of the same features of FIG. 5A. As depicted in FIG. 5B, the discrete time commutator 555 can be configured/arranged between the SH 504 and the M quantizers 508. Such an arrangement can allow the discrete time commutator 555 to accommodate the lower speed requirements of the M quantizers 508 with the relatively higher speed of SH 504. This can allow, for example, maximal increase in the bandwidth of the digital filter bank to digitally down convert one or more radio frequency signals to extract digital baseband channels. The discrete time commutator 555 may be configured/arranged to receive one or more input signal(s) X(m) 506 from the SH 504 and demultiplex between the M quantizers 508 to obtain the individual channels from the M input signal(s) X(m) 506. In some embodiments, the discrete-time commutator 555 also implements the delay and down-sampling. For a sampling period Ts, SH unit 504 samples the signal X(t) 502 at the sampling frequency of $f_s$ 503 and converts the analog signal X(t) 502 into discrete time signals X(m) 506, where m means at time interval mTs. The commutator 555 takes M input samples of signal X(m) 506 and distributes them to the polyphase branch in the reverse sequence M−1, M−2, ..., 1, 0. When each of the quantizers 508 receives a new input at time instant n=mM, the quantizer 508 transfers the discrete signal into digital bit words for the polyphase filter bank to process.

In some embodiments, this technique can be used in current PFFT in the digital domain. In some embodiments, the commutator block implementation can be moved from the digital domain to discrete time domain. In some embodiments, much higher sampling frequencies and wider bandwidths can be achieved. By using discrete-time commutator techniques such a PFFT can in some embodiments minimize or avoid difficulties of phase measurement, sensing, and adjustment that may be encountered in prior techniques such as interleaved ADC In some embodiments, there may be no limitation for the decimation factor M, but the range of M may be affected by several factors. For example, a larger value of M may be associated with a more complex circuit and/or larger chip area in some cases. Accordingly, the value of M may correlate with circuit implementation. In another example, a larger value of M may correlate with a longer FIR filter. This can, in some cases, correlate with an increased system response delay, for example.

In some embodiments, the SH unit 404 and the quantizer unit 406 are two separate circuit components in the ADC 302. In some embodiments, the SH unit 404 includes switched capacitor circuitry to sample and hold analog signals at the sampling frequency. The analog signal may be effectively changed to discrete time signals after the SH unit 404. The quantizer unit 508 may be configured to transfer the discrete time signal into digital bit words.

Figure 6A:
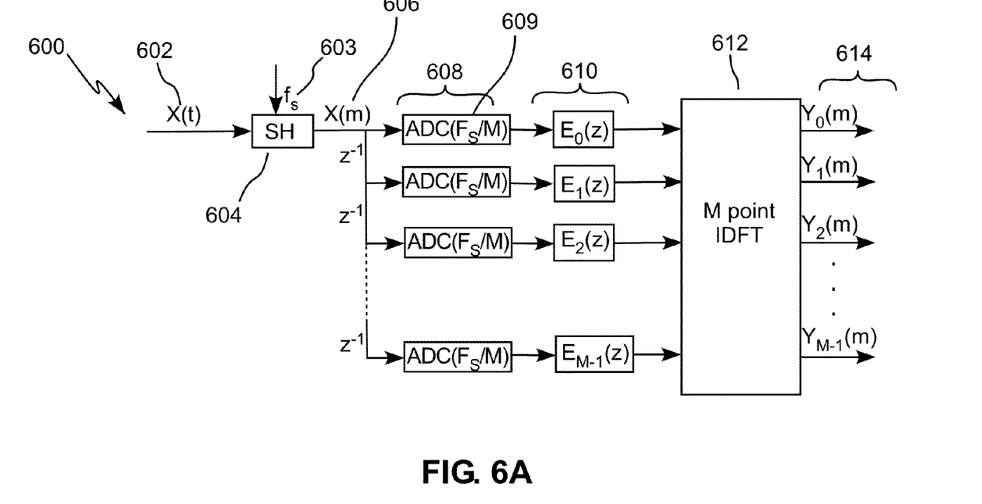
FIG. 6A depicts a block diagram of a block diagram of a PFFT with lower speed of ADC.

FIG. 6A illustrates some embodiments of a direct digital RF conversion system utilizing an ADC structure. A digital filter bank 600 can be configured so that a SH unit 604 is positioned, arranged or adapted in a main stream or main sample stream to receive an one or more input signal(s) X(t) 602 and generate a time-discrete sampling sequence X(m) 606 at a SH sampling frequency 603 of $f_s$. In some embodiments, the digital filter bank 600 is a PFFT. The digital filter bank 600 can be configured so that M ADC unit(s) 608 are positioned, arranged, configured and/or adapted to operate on each one of the M channels to sample at a ADC sampling frequency or speed 609 of $f_s/M$. Thus, each of the ADC units 608 can have a lower speed of operation than the SH unit 604. For example, the SH unit 604 can have an SH sampling frequency 603 of $f_s$, while each ADC 608 can have a ADC sampling frequency or speed 609 of $f_s/M$. As illustrated in FIG. 6A, the ADC unit(s) 608 output signals 610 $E_0(z) \ldots E_{M-1}(z)$, which are processed by an M point IDFT 612 which is configured to output/provide one or more digital baseband channels 614 $y_0(m) \ldots y_{M-1}(m)$. With this configuration/arrangement circuit properties can allow for the speed of the unit of SH unit 604 to be much faster than each of the individual ADC(s) 608. For example, based on current IC technology, the speed of the SH unit 604 can be faster than 60 GHz, while the speed of the one or more ADC(s) 608 with 12-bit resolution and dynamic range can be around 1 GHz. Therefore, the configuration/arrangement of separating the SH unit 604 and the one or more ADC(s) 608 to operate at different speeds in the PFFT filter bank 600 can at least extend the PFFT filter bank 600 to do digital direct RF down conversion for signals with a bandwidth of 30 GHz, which may greatly impact UWB receiver design by completely removing analog a RF down converter and moving the ADC closer to an antenna to achieve much simpler receiver structure, better performance, and higher power efficiency. Such an arrangement provides a PFFT configured, designed, arranged and/or adapted to operate with a much lower speed ADCs 608 than would otherwise be required.

In some embodiments of the PFFT 600, the delay chain and down sampling are executed immediately after the SH unit 604 and are implemented in discrete time domain. In some embodiments, the delay chain and down sampling are executed immediately after the ADC(s) 608 and are implemented in the digital domain. In some embodiments, the maximal sampling frequency of the PFFT 600 can be large than 20 GHz, therefore, the bandwidth of the PFFT 600 can be greater than 10 GHz.

Figure 6B:
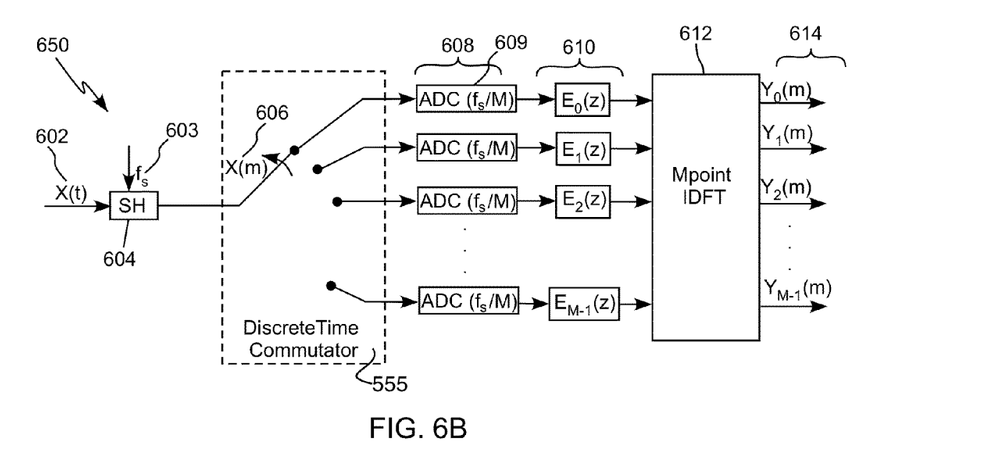
FIG. 6B depicts a block diagram of a block diagram of a PFFT with lower speed of ADC and a discrete time commutator.

FIG. 6B includes one or more of the features of FIG. 6A, and also shows a discrete time commutator 655 configured/arranged to receive one or more input signal(s) X(m) 606 from the SH 604. In some embodiments, the discrete time commutator 655 can demultiplex between two or more quantizers 608 to obtain the individual channels from the one or more input signal(s) X(m) 606. In some embodiments, the delay and down sampling are implemented by a discrete-time commutator 655 as shown in FIG. 6B, which depicts many of the same features of FIG. 6A. In some embodiments, the discrete-time commutator 655 implements the delay and down-sampling. For a sampling period Ts, SH unit 604 samples the signal X(t) 602 at the sampling frequency of $f_s$ 603 and converts the analog signal X(t) 602 into discrete time signal X(m) 606, where m means at time interval mTs. The commutator takes M input samples of signal X(m) 606 and distributes them to the polyphase branch in the reverse sequence M−1, M−2, . . . , 1, 0. When each of the ADCs 608 receives a new input at time instant n=mM, the ADC 608 transfers the discrete signal into digital bit words for the polyphase filter bank to process.

In some embodiments, this technique can be used in current PFFT in the digital domain. In some embodiments, the commutator block implementation can be moved from the digital domain to discrete time domain. In some embodiments, much higher sampling frequencies and wider bandwidths can be achieved. By using discrete-time commutator techniques such a PFFT can in some embodiments minimize or avoid difficulties of phase measurement, sensing, and adjustment that may be encountered in prior techniques such as an interleaved ADC.

Figure 7:
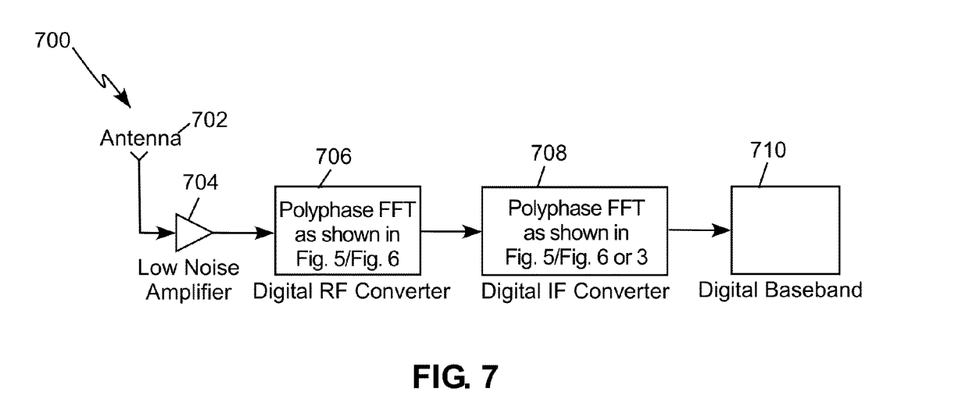
FIG. 7 depicts a block diagram of a block diagram of a full digital UWB receiver.

FIG. 7 illustrates some embodiments that include an antenna 702 connected to a low-noise amplifier 704. A digital RF converter 706 can be connected to the low noise amplifier 704. In some embodiments, the digital RF converter 706 may be directly connected to the antenna 702. In some embodiments, the digital RF converter 706 can be a PFFT. In some embodiments, the digital RF converter 706 can be the digital filter bank 500 or the PFFT 600. The digital RF converter 706 can be arranged/configured to connect or transmit one or more signals to a digital IF converter 708. In some embodiments, the digital IF converter 708 can be a PFFT. In some embodiments, the digital IF converter 708 can be the PFFT 600. In some embodiments, the digital IF converter 708 can be the PFFT 300. The digital RF converter 706 and digital IF converter 708 may be used either alone or in combination to extract digital baseband 710.

Figure 8:
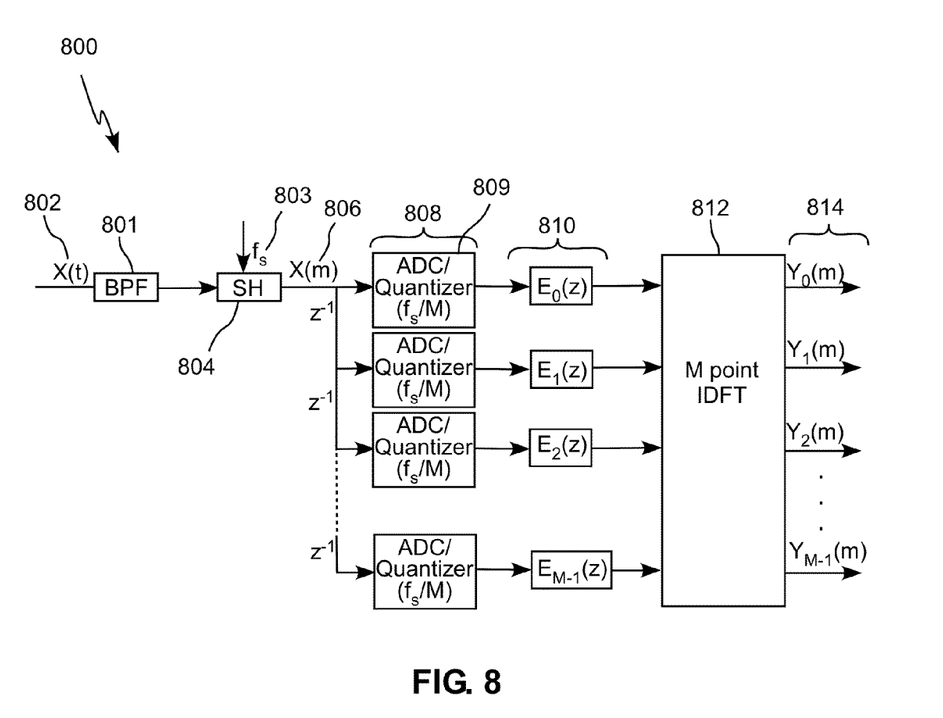
FIG. 8 depicts a block diagram of a PFFT filter bank with high speed sampling and hold, M times speed reduced ADC, and bandpass sampling techniques.

FIG. 8 illustrates some embodiments of a direct digital RF conversion system utilizing bandpass filter in combination with an ADC structure. A digital filter bank 800 can be configured so that a bandpass filter 801 is positioned, arranged or adapted to receive one or more input signal(s) X(t) 802 and provide a filtered signal to a SH unit 804 arranged in a main stream or main sample stream to generate a time-discrete sampling sequence X(m) 806 at a SH sampling frequency 803 of $f_s$. In some embodiments, the digital filter bank 800 is a PFFT. The digital filter bank 800 can be configured so that the M ADC/Quantizer unit(s) 808 are positioned arranged, configured and/or adapted to operate on each one of the M channels to sample at an ADC sampling frequency or speed 809 of $f_s/M$. Thus, the ADC/Quantizer unit(s) 808 can have a lower speed of operation than the sampling speed of the SH unit 804. For example, the SH unit 804 can have an SH sampling frequency 803 of $f_s$, while the ADC can have a ADC sampling frequency or speed 809 of $f_s/M$. As illustrated in FIG. 8, the ADC/Quantizer unit(s) 808 output signals 810 $E_0(z) \ldots E_{M-1}(z)$, which are processed by an M point IDFT 812 which is configured to output/provide one or more digital baseband channels 814 $y_0(m) \ldots y_{M-1}(m)$.

A method for extracting digital baseband channels from a signal can include digitally down converting one or more input signals including a radio frequency signal to extract one or more digital baseband channels. The method can also include any digitally down converting one or more intermediate frequency signals to extract one or more digital baseband channels, performing a sample and hold of the input signal at a first frequency $f_s$, and/or quantizing the input signal at a second frequency. The second frequency can be $f_s/M$, wherein M comprises a decimation factor for sampling. The performing sample and hold of the input signal can be applied to a main sample sequence and the quantizing can be applied to a subband. The digitally down converting can include using a digital filter bank. The digital filter bank can be a PFFT. Any of these steps/features recited in the method can be performed in any order and/or sequence.

EXAMPLES

By way of example, this section of the disclosure illustrates some simulations of the design concept of the PFFT filter bank. The following simulations are for illustrative purposes only, and are not intended to limit/alter the scope of any claim or the arrangement or performance of any digital PFFT filter bank in any way.

A MATLAB simulation for comparing the prior art design shown in FIG. 3 and the designs shown in FIGS. 6A and 6B was performed at the sample frequency ($f_s$) of 1 GHz. In the simulation were 64 channels with decimation factor (M) of 64 for both designs. In both simulations, the dynamic range of ADC was 8 bits. The filter bandwidth of the prototype filter was 1/(2M) of the sampling frequency, $f_s$. Therefore, at the sampling frequency of 1 GHz, the signal bandwidth of each channel for PFFT filter bank was 15.625 MHz. The first 32 channels show the signal subband of the real part of signal (positive frequency) and the next 32 channels show the signal subband of real part of the signal (negative frequency). To see the down conversion and filtering function of the PFFT filter bank, a test signal was generated. The signal was the time discrete sample sequence of the signal at the unit of sample and hold at the sampling frequency of 1 GHz with signal to noise ratio (SNR) of 15 dB. The test signal included ten signal bands. The first signal band was a linear chirp signal at the third channel (31.25-46.875 MHz) with signal bandwidth of about 5 MHz. The second signal band was a quadratic chirp signal at the fifth channel (62.5-78.125 MHz) with signal bandwidth of about 4 MHz. The third signal band was a logarithmic chirp signal at the eighth channel (109.375-125 MHz) with signal bandwidth of about 4 MHz. The fourth signal band was a frequency modulation (FM) signal at the tenth channel (140.625-156.25 MHz) with signal bandwidth of about 4 MHz. The fifth signal band was a phase shifting key (PSK) signal. This PSK signal band was in channel 13 (187.5-203.125 MHz), but the signal could spread into one or more neighboring channels. The sixth signal band was frequency shifting key (FSK) signal. This FSK signal band was in channel 18 (265.625-281.25 MHz), but the signal could spread into one or more neighboring channels. The seventh signal band was a quadratic amplitude modulation (QAM) signal. This QAM signal band was in channel 21 (312.5-328.125 MHz), but the signal could spread into one or more neighboring channels. The eighth signal band was a linear chirp signal at the 25th channel (375-390.625 MHz) with signal bandwidth of about 6 MHz. The ninth signal band was a quadratic chirp signal at the 28th channel (421.875-437.5 MHz) with signal bandwidth of about 6 MHz. The tenth signal band was a logarithmic chirp signal at the 31th channel (468.75-484.375 MHz) with signal bandwidth of about 6 MHz.

As described previously, the 1-32 channels show the result of real value of complex signal and the 33-64 channels show the result of image value of the complex signal. The simulation focused on the real value signal. Therefore, only the result of 1-32 channels are discussed. The result for 33-64 channels is similar to that for 1-32 channels.

The ten signal bands were successfully filtered into the correspondent channel. The first signal, the linear chip signal, appears in channel 3 for both discrete time sequence and frequency response. The second signal, the quadratic chirp signal, exists in channel 5 for both discrete time sequence and frequency response. The third signal, the logarithmic chirp signal, seats in channel 8 for both discrete time sequence and frequency response. The fourth signal, the FM signal, is in channel 10 for both discrete time sequence and frequency response. The fifth signal, the PSK signal, occupies mostly in channel 13 for both discrete time sequence and frequency response. The sixth signal, the FSK signal, is mostly in channel 18 for both discrete time sequence and frequency response. The seventh signal, the QAM signal, appears mostly in channel 21 and 22 for both discrete time sequence and frequency response. The eighth signal, the linear chirp signal, is in channel 25 for both discrete time sequence and frequency response. The ninth signal, the quadratic chirp signal, is in channel 28 for both discrete time sequence and frequency response. The tenth signal, the logarithmic chirp signal, is in channel 31 for both discrete time sequence and frequency response. These signal bands in each channel match closely with those signal bands in the testing signal. Therefore, the PFFT filter bank design was shown to successfully produce the function of IF down conversion and filtering. There was not any significant different result for each signal band for each channel as compared these results demonstrate that the concept of separating the function units of sample and hold and quantizer in ADC for PFFT filter bank design is possible. By setting the sampling frequency of $f_s$ for the unit of sample and hold in the main sample sequence and setting the sampling frequency of $f_s/M$ (M is the decimation factor for sampling) in the subband, the PFFT filter bank can provide the function of direct digital RF down conversion.

To further demonstrate this concept for PFFT filter bank, a simulation of PFFT filter bank with this design concept for signal band width of 64 GHz was performed. For this simulation, the dynamic range of the ADC was still 8 bits.

During the simulation of 64 GHz signal bandwidth, the PFFT and testing signal were used. The sampling frequency, $f_s$, for the testing signal was 64 GHz, and the SNR for the testing signal was 15 dB. The number of polyphase channels was 64 and the signal bandwidth for each channel was approximately 1 GHz. The first signal band was a linear chirp signal at the third channel (2-3 GHz) with signal bandwidth of about 400 MHz. The second signal band was PSK signal. This PSK signal band could be in channel 5 (4-5 GHz), but the signal may spread into one or more neighboring channels. The third signal band was a quadratic chirp signal at the eighth channel (7-8 GHz) with signal bandwidth of about 400 MHz. The fourth signal band was a FSK signal at the tenth channel (9-10 GHz), though it could spread into one or more neighboring channel(s). The fifth signal band was logarithmic signal with signal bandwidth of 400 MHz in channel 13

(12-13 GHz). The sixth signal band was a quadratic amplitude modulation (QAM) signal. This QAM signal band could be in channel 18 (17-18 GHz), but the signal could spread into one or more neighboring channel(s). The seventh signal band was a linear chirp signal at the 21th channel (20-21 GHz) with signal bandwidth of about 500 MHz. The eighth signal band was a FM signal at the $25^{th}$ channel (24-25 GHz) with signal bandwidth of 200 MHz. The ninth signal band was a quadratic chirp signal at the 28th channel (27-28 GHz) with signal bandwidth of about 500 MHz. The tenth signal band was a logarithmic chirp signal at the 31th channel (30-31 GHz) with signal bandwidth of about 500 MHz.

Only the real value signal was focused on for the simulation. Therefore, only the result of 1-32 channels is discussed. The result for 33-64 channels was similar to that for 1-32 channels. Ten signal bands were all successfully filtered into the correspondent channel. The first signal, the linear chip signal, appeared in channel 3 for both discrete time sequence and frequency response. The second signal, PSK, existed in channel 5 and 6 for both discrete time sequence and frequency response. The third signal, the quadratic chirp signal, was seated in channel 8 for both discrete time sequence and frequency response. The fourth signal, the FSK signal, spread out into channels 10 and 11 for both discrete time sequence and frequency response. The fifth signal, the logarithmic chirp signal, occupied in channel for both discrete time sequence and frequency response. The sixth signal, the QAM signal, was mostly in channel 17, 18, and 19 for both discrete time sequence and frequency response. The seventh signal, the linear chirp signal, appeared in channel 21 for both discrete time sequence and frequency response. The eighth signal, the FM signal, was in channel 25 for both discrete time sequence and frequency response. The ninth signal, the quadratic chirp signal, was in channel 28 for both discrete time sequence and frequency response. The tenth signal, the logarithmic chirp signal, was in channel 31 for both discrete time sequence and frequency response. All these signal bands in each channel matched well with those signal bands in the testing signal.

The simulation results demonstrated the accuracy of design of a digital filter bank such as PFFT filter bank. By separating the two function units, sample and hold and quantizer, in an ADC, setting the sampling frequency of $f_s$ for the unit of sample and hold in the main sample sequence and setting the sampling frequency of $f_s/M$ (M is the decimation factor for sampling) in the subband, the PFFT filter bank can provide the function of direct digital RF down conversion. By using this technique, both analog IF converter and RF converter can be replaced by fully digital can be replace by PFFT filter bank. Therefore, all digital down conversion can be achieved in UWB receiver from RF to baseband. By this design, the UWB receiver structure and circuitry may be much simpler, IQ imbalance issue may be fully resolved, DSP may be much closer to antenna, and power efficiency may be improved significantly. Furthermore, the technique/design can be integrated with bandpass sampling techniques. If N is the ratio between the signal center frequency and the sample frequency at S/H, by using this design, the PFFT can be directly applicable to UWB communication signal with $Nf_s$ center frequency and 30 GHz bandwidth without any analog down conversion.

Some or all of the features described in this disclosure may be used in many applications, including—but not limited to—radar systems, for example. For example, directly digital RF conversion can be achieved for radar at least from VHF to Ka band. An example of one radar is Boeing's electronic Warfield (EW) radar, for which the full digital UWB receiver can be achieved.

Examples of radar frequency bands for which the ultrawideband receiver may be used include VHF (50-330 MHz), typically used in very long-range surveillance; UHF (300-1,000 MHz), typically used in very long-range surveillance; L (1-2 GHz), typically used in Long-range surveillance and enroute traffic control; S(2-4 GHz.), typically used in moderate-range surveillance, terminal traffic control and long-range weather; C (4-8 GHz.), typically used in long-range tracking and airborne weather; X (8-12 GHz.), typically used in short-range tracking, missile guidance, mapping, marine radar, and airborne intercept; $K_u$ (12-18 GHz.), typically used in high resolution mapping and satellite altimetry; K(18-27 GHz.), typically used in $H_2O$ absorption; $K_a$ (27-40 GHz.), typically used in very high resolution mapping and airport surveillance; and mm (40-100+GHz), which is currently experimental. Various embodiments may be used in other frequency bands as well.

The 57-64 GHz frequency band may be used for Gigabit short range wireless communication system. It may be implemented, for example, in an aircraft for in-flight entertainment (IFE) and/or inside a car for the in-car entertainment (ICE). By using this novel PFFT filter bank technique, the UWB receiver structure and circuitry may be much simpler, IQ imbalance issue may be fully resolved, DSP may be much closer to antenna, and power efficiency may be improved significantly.

The U.S. Federal Communication Commission (FCC) allocated 75 MHz spectrum at 5.9 GHz for Dedicated Short Range Communications (DSRC) devices to be used for car-to-car as well as car-to-infrastructure communications. The various embodiments and techniques may also be utilized in car-to-car and car-to-infrastructure in current and future vehicles.

Furthermore, the various embodiments and techniques may also have many benefits to current mobile and wireless communication products including, but not limited to—GPS (1215-1300 MHz and 1550-1645.5 MHz), GSM (869.2-894.2 MHz, 935.0-960.0 MHz, 1805.2-1879.8 MHz, and 1930.2-1989.8), 3G (1710-1755 MHz and 2110-2155 MHZ), and 4G (2496-2690 MHz), for example. Some of the many advantages of the features described in this disclosure include—but are not limited to—further solving the IQ imbalance issue, reducing the circuitry in the analog domain, simplifying the receiver system, and improving the system power efficiency by moving ADC much closer to antenna.

While certain features have been described herein, many other features are contemplated and fall within the scope of the disclosure. It is to be understood that any elements, parts and/or steps of any embodiment may be interchangeable and/or replaced by elements, parts and/or steps from other embodiments, or left out altogether.

What is claimed is:

1. A digital filter bank, comprising:
a first sample and hold unit configured to sample an input signal at a first frequency and output one or more first sampled signals;
one or more second sample and hold units configured to sample the one or more first sampled signals at a second frequency different than said first frequency and output one or more second sampled signals;
one or more quantizers configured to receive and quantize the second sampled signal to output one or more quantized signals; and one or more polyphase component filters to filter said one or more quantized signals and output one or more filtered signals.

2. The digital filter bank of claim 1, wherein the polyphase component filters comprise finite impulse response filters.

3. The digital filter bank of claim 1, further comprising an inverse discrete fourier transformer ("IDFT") configured to extract one or more digital baseband channels from said one or more filtered signals output.

4. The digital filter bank of claim 1, wherein said one or more second sampled signals correspond to one or more channels.

5. The digital filter bank of claim 1, wherein the quantizer comprises an analog to digital converter ("ADC").

6. The digital filter bank of claim 1, further comprising a bandpass filter configured to filter said input signal.

7. The digital filter bank of claim 1, wherein said one or more second sample and hold units comprise M second sample and hold units and wherein the first sample and hold unit samples at a rate of $f_s$ while the M second sample and hold units each sample at a rate of $f_s/M$.

8. A digital filter bank, comprising:
a first sample and hold unit configured to sample an input signal at a first frequency and output one or more discrete time signals;
a discrete time commutator configured to receive and demultiplex the one or more first sampled signals to one or more corresponding quantizers and output one or more quantized signals, the one or more corresponding quantizers quantizing at a second frequency different than said first frequency; and
one or more polyphase component filters to receive and filter said one or more quantized signals and output one or more filtered signals.

9. The digital filter bank of claim 8, wherein the polyphase component filters comprise finite impulse response filters.

10. The digital filter bank of claim 8, further comprising an inverse discrete fourier transformer ("IDFT") configured to extract one or more digital baseband channels from said one or more filtered signals output.

11. The digital filter bank of claim 8, wherein said one or more second sampled signals correspond to one or more channels.

12. The digital filter bank of claim 8, wherein the discrete time commutator is configured to delay and down-sample said input signal.

13. The digital filter bank of claim 8, wherein the input signal is an analog signal.

14. The digital filter bank of claim 8, wherein the quantizer transfers the discrete signal into digital bit words.

15. The digital filter bank of claim 8, wherein the quantizer comprises an analog to digital converter ("ADC").

16. The digital filter bank of claim 8, wherein said first frequency is $f_s$ and wherein he discrete time commutator is configured to receive and demultiplex the one or more first sampled signals onto M corresponding quantizers for outputting M quantized signals, the M corresponding quantizers each quantizing at a second frequency which is equal to $f_s/M$.

17. A method for digitally filtering a signal, comprising:
sampling an input signal at a first frequency to output one or more first sampled signals;
sampling and holding the first sampled signals at a second frequency to output one or more second sampled signals;
quantizing the one or more second sampled signals to output channelized signals; and
filtering said one or more quantized signals and outputting one or more filtered signals using one or more polyphase component filters, and
wherein the first frequency is greater than the second frequency.

18. The method of claim 17, wherein the first frequency is fs and the second frequency is fs/M and wherein M is a decimation factor.

19. The method of claim 17, further comprising extracting one or more digital baseband channels from said one or more filtered signals output using an inverse discrete fourier transformer ("IDFT") configured.

20. The method of claim 17, wherein the quantizer comprises an analog to digital converter ("ADC").

21. A digital quantizing apparatus for sampling an incoming stream of data, the digital quantizing apparatus comprising:
i. an input sample and hold circuit coupled to said incoming stream of data, the input sample and hold circuit sampling the incoming stream of data at a rate equal to $f_s$;
ii. plurality of downstream sample and hold circuits connected in a parallel arrangement with each other and also coupled to sample a portion of the data sampled by the input sample and hold circuit, the parallel arrangement of downstream sample and hold circuits comprising M sample and hold circuits each of which samples data at a rate equal to $f_s/M$.

22. A digital quantizing apparatus for sampling an incoming stream of data, the digital quantizing apparatus comprising:
i. an input sample and hold circuit coupled to said incoming stream of data, the input sample and hold circuit sampling the incoming stream of data at a rate equal to $f_s$;
ii. plurality of downstream analog to digital convertor circuits connected in a parallel arrangement with each other and also coupled to receive a portion of the data sampled by the input sample and hold circuit, the parallel arrangement of downstream digital convertor circuits comprising M analog to digital convertor circuits each of which receives data from the input sample and hold circuit at a rate equal to $f_s/M$;
iii. a commutator or switch having M positions for connecting an output of the input sample and hold circuit with a single one of said M analog to digital convertor circuits in each of its M positions.

* * * * *